(12) United States Patent
Kenwright (10) Patent No.: US 7,868,778 B2
(45) Date of Patent: Jan. 11, 2011

(54) APPARATUS AND METHOD FOR PROXIMITY-RESPONSIVE DISPLAY MATERIALS

(76) Inventor: David Norris Kenwright, 9 Seascape Road, Auckland (NZ) 1050

( * ) Notice: Subject to any disclaimer, the term of this patent is extended or adjusted under 35 U.S.C. 154(b) by 323 days.

(21) Appl. No.: 12/067,366

(22) PCT Filed: Sep. 20, 2006

(86) PCT No.: PCT/NZ2006/000243

§ 371 (c)(1),
(2), (4) Date: Mar. 19, 2008

(87) PCT Pub. No.: WO2007/035115

PCT Pub. Date: Mar. 29, 2007

(65) Prior Publication Data

US 2008/0238706 A1  Oct. 2, 2008

(30) Foreign Application Priority Data

Sep. 20, 2005  (NZ) ................................. 542510

(51) Int. Cl.
*G08B 21/00* (2006.01)
(52) U.S. Cl. ............ 340/686.6; 340/691.6; 340/539.23; 340/815.4
(58) Field of Classification Search ............... 340/686.6, 340/539.23, 815.4, 691.6; 235/375, 382, 235/385, 376; 345/174, 178; 702/128; 705/5, 705/20
See application file for complete search history.

(56) References Cited

U.S. PATENT DOCUMENTS

| 6,262,662 | B1 | 7/2001 | Back et al. |
| 6,708,176 | B2 | 3/2004 | Stunk et al. |
| 6,819,316 | B2 | 11/2004 | Schulz et al. |
| 7,021,535 | B2 * | 4/2006 | Overhultz et al. ........... 235/382 |
| 7,522,046 | B2 * | 4/2009 | Decker et al. ............ 340/568.1 |
| 2004/0217877 | A1 | 11/2004 | Kokonaski et al. |
| 2004/0227147 | A1 | 11/2004 | Affolter et al. |
| 2005/0080818 | A1 | 4/2005 | Kindberg et al. |

FOREIGN PATENT DOCUMENTS

WO   8503374 A1   8/1985

* cited by examiner

*Primary Examiner*—Hung T. Nguyen
(74) *Attorney, Agent, or Firm*—Brooks Kushman P.C.

(57) ABSTRACT

Apparatus and a method for causing a printed display (poster, placard or promotional flier) to become interactive when a person points to part of the display. Behind the display a customized layout of capacitive proximity sensors printed with conductive inks on to a low-cost disposable, replaceable substrate (paper, plastic, cardboard) in alignment with visually significant features of the display is connected to proximity-sensing circuitry. Audio-visual or multimedia responses using pre-recorded or synthesized information are reproduced in event of a selection.

28 Claims, 4 Drawing Sheets

APPARATUS AND METHOD FOR PROXIMITY-RESPONSIVE DISPLAY MATERIALS

FIELD

This invention relates to hardware for information presentation and more particularly for interactive information presentation involving capacitative proximity sensors or like means for sensing a presence of an enquiring member, and making an appropriate response. In particular the invention relates to means to graphic displays for use with capacitative proximity sensors and provides a means to render printed graphical displays interactive through the application of printed sensor-bearing sheets.

DEFINITIONS AND ABBREVIATIONS

Figure 1:
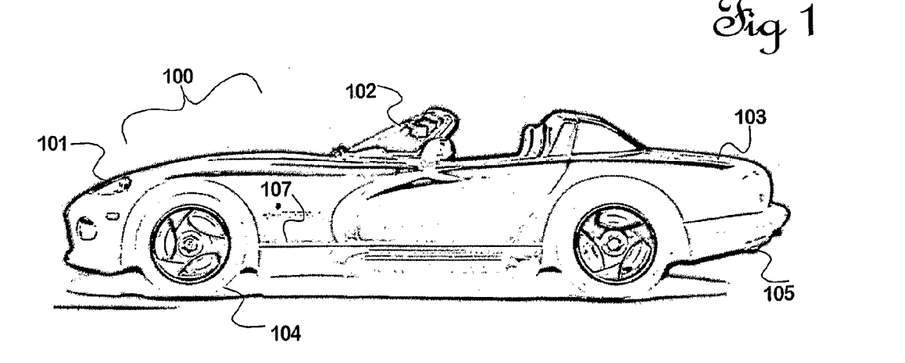
FIG. 1 shows an example poster. This example is a sports-car image.

Poster: a term used herein to refer to a display surface bearing indicia, such as a conventional sheet of advertising material printed onto paper or other substrate, or a sheet bearing other textual and/or graphic information. FIG. 1 illustrates a poster. Typical examples of posters are larger than A4 size although the present invention is not limited as to size.

Indicia: a term used herein to refer to visible marks made on a surface. In many, but not all cases such marks will be derived from the work of a graphic artist or similar. Some indicia may be generated such as by a liquid-crystal display (LCD), a projected image, or by lamps; including organic LEDs.

Figure 2:
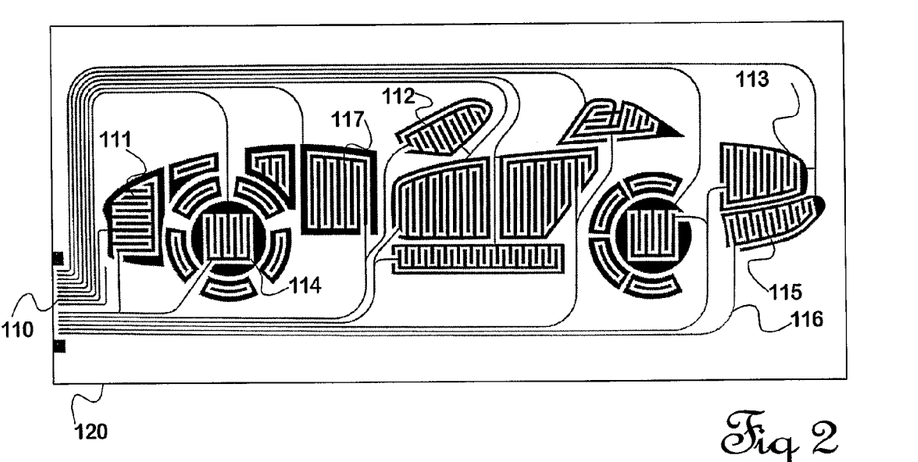
FIG. 2: shows an example electrode set laid out on a replaceable paper-like backing sheet (the "customised sensor-bearing substrate" or CSBS) to match visually distinct elements in the image of FIG. 1 that is placed immediately behind the poster.

Customised sensor-bearing substrate (CSBS) is a term used herein to refer to a custom layout of a plurality of sensing areas mostly applied as printed conductors upon a substrate. The sensing areas are laid out with reference to the spatial position of features of interest over the surface of a corresponding poster or the like. FIG. 2 illustrates a CSBS according to the invention.

Electrodes: a term used herein to refer to patterns of conductive material that terminate connecting traces or wires on a CSBS. Each pattern usually comprises interdigitating sets, as pairs, of electrodes. See for example 115 in FIG. 2. Each set serves as the plates of a transversely laid down capacitor, which faces outwards and serves as an active proximity sensing area. Interdigitation and spacing of electrodes increases the strength of an alternating electric field projected through the poster into a nearby volume and is used to shape and concentrate the sensitive area.

BACKGROUND

Posters, placards, packaging and promotional flyers are commonplace media for presenting and communicating information to the public. The printed content is generally short-lived since the media is periodically updated, replaced, or disposed of in order to promote new goods, services or information. Such media goes stale reasonably quickly. These media are generally visual forms of communication, although they may sometimes be augmented with audio devices that play pre-recorded messages.

It is a challenge to create an effective process for linking a person to some information that he or she desires, or that some other person believes that they should receive, when under various pressures typical of modern society. Visual presentations and advertisements portray very little information because they are typically viewed for only several seconds. Language independence is desirable so that the person can interpret the information in his or her native language. Allowance should be made for lack of time, and for disabilities such as in eyesight, hearing and/or in motor skills.

Earlier kiosk-type active presentations include public transport timetables that present indicia over an area upon a sign at a public transport stop, where a user can get relevant information by pressing a selected button in accordance with displayed information. The present time of day and day of the week is often included in the information. Touch screen kiosks, which combine a computer and a touch-screen monitor, provide both visual and audible information to the public. They are able to convey considerably more information than a static image and generally capture the user's interest for longer. The main drawback of this technology is the high cost of the equipment and lengthy development time for the software, plus the necessity to protect the system from physical or environmental damage. All these factors limit the applications and locations where touch screen kiosks can be utilised.

A UK firm, Quantum Research Group, (1 Mitchell Point, Ensign Way, Hamble, Southampton SO31 4RF United Kingdom) has developed and markets a family of charge transfer integrated circuits called QMatrix controllers. These controllers sequentially scan an array of two-part electrodes, pumping charge across the electrodes, and measuring variations in the amount of charge received back. Significant variations in the amount of charge are registered as proximity detections. One of the QMatrix controllers used in the present invention is the "QT60486 transverse charge-transfer integrated circuit—a self-contained digital controller capable of detecting near proximity or touch on up to 48 two-part electrodes". This specification imports the following data sheets available, among others, from the company web site, www.qprox.com. at 16 Aug. 2005, by way of reference.

1. QT60486_801.pdf re. QT60486 48-key Qmatrix IC. Prepared May 2005.

2. QMATRIX_DESIGN_RULES.pdf re Quantum Research Application Note AN-KD01 QMatrix Panel Design Guidelines.

3. Electrode design for Charge Transfer Sensing (by Hal Phillipp)

The QT60486 device serves 32 or 48 keys in an X-Y scanned matrix method, is self-calibrating, designed to be resistant to interference and spurious results, has electrostatic damage (ESD) protection, and delivers an output encoded in the RS-232 or the SPI communications format. A capacitance change of a few picofarads at conductive electrodes can be detected by the chip, corresponding to movement of a hand or finger some centimeters away from a connected conductive surface. The primary market for the Quantum range of QMatrix integrated circuits is for keypads, appliances and portable instruments. (This chip is described by way of example. The manufacturers may have or may develop alternatives and other manufacturers may offer second-source components or different capacitative proximity sensors. The present application is not to be read as being limited or linked in any way to the currently preferred manufacturer, device or range).

PRIOR ART

We concentrate on electronic proximity sensing (generally reliant on capacity-change sensing) as a basis for the present invention work.

A related invention (U.S. Pat. No. 6,262,662 Back et al) has been used in "electronic books" wherein a book is provided with embedded tags for page identification coupled with proximity sensors for accessing digitally stored content; the storage and playback means for which may be included within the book binding. The device can determine which page is being read such as by the use of RFID tags, and provide supplementary page-related information according to where a reader's finger may be pointed; the finger position being detected by means of a proximity sensor. No pre-planned, poster-specific position detection system is disclosed here, nor a means to update the system with an entirely new proximity sensor layout as required for short-lived advertising or similar posters.

US 2005/0080818 to Hewlett Packard describes insertion of non-digital active content in pages (such as non-HTML based pages presented on a computer screen) and seeks to provide (for example) HTML links for printed pages which are fixed in tangible mediums. The invention assumes the use beside the displayed image of an X-Y position transducer for tracking the position of a special stylus or pen (for example Seiko's "Inklink") over a displayed image. There is no teaching toward the use of disposable proximity sensors arranged in customised patterns that are designed specifically to match an overlaid graphic on a poster. . . . It would be inconvenient to expect the public to use a special stylus or pen.

OBJECT

It is an object of this invention to create proximity sensitive posters or printed display materials having a customised placement of sensing areas, which are both inexpensive and replaceable, proximity sensing means with customised placement of sensing areas in order to provide direct correspondence between the graphic design of the poster and other electronic devices that dispense associated information or experiences, or at least to provide the public with a useful choice.

SUMMARY

In a first broad aspect the invention provides an interactive information display employing proximity sensing means in order to respond in a specific, planned manner to a viewer in proximity to the display (the "proximate viewer") wherein the display includes (a) visible indicia laid down upon a flat substrate (herein called "a poster"), (b) a replaceable non-conductive flat substrate (herein called a "customised sensor-bearing substrate" or CSBS) bearing a layout of at least two conductors; (c) each conductor terminating in one of at least one pair of areally enlarged, closely apposed yet separated conductors (herein called "electrodes") that serve to spatially localise a proximity-sensitive field, the at least one electrode pair being located within at least one selected area in relation to the overlaid poster when the CSBS and the poster are mounted together and providing, when in use, a localised proximity-sensitive function capable of being identified with a localised part of the poster by the proximate user, (d) at least one disconnectable connection means capable of connecting the CSBS to at least one non-replaceable charge transfer controller, capable of using the at least one electrode pair as a localised proximity sensing means, which controller in turn is connected to (e) at least one non-replaceable output device capable of selecting and sending a communication, based on the content of the selected area of the poster to the proximate viewer.

Preferably the interactive information display is housed in a durable, watertight housing.

Preferably the sensing means is based on sensing the electrical capacity change within a two-dimensional capacitor beneath the poster in response to an approaching person or hand.

Preferably each sensitive area of the CSBS comprises a conductive layer selectively applied to the substrate in the form of a two-part interleaved electrode configuration comprising a two-dimensional capacitor surrounded when in use by an electric field, the geometric outline of which conforms to or lies within a boundary of a selected region of the poster.

Preferably the CSBS is comprised of a sheet material having a dielectric property.

Preferably the CSBS uses a low-cost dielectric substrate so that replacement or revision of the customised sensor layout is facilitated as and when required.

Preferably the CSBS is rectangular, though the CSBS may have a shaped edge (such as to fit behind a poster having a non-rectangular shape), or may have cut-outs to accommodate output or input devices (such as displays, speakers, keyboards or coin payment means).

Optionally the CSBS is rigid, though it may be capable of being rolled, folded, cut or otherwise deformed without breaking the conductors.

Optionally a stretchable version of CSBS (also having stretchable conductors) may be supplied for installation over a three-dimensional surface.

Optionally the CSBS is applied to a three-dimensionally shaped substrate, examples of which include packages, ceramic or glass vessels, vehicles, models, works of art, and shop fittings.

Optionally the CSBS is provided within a laminate bearing the poster on one or both sides.

Preferably the CSBS is provided behind the poster and out of sight.

Optionally the CSBS is provided on the front side of the poster and is visible.

Optionally the CSBS may carry electronic devices in addition to the electrodes and tracks leading to connectors: including without limitation conductive organic materials, electroluminescent materials, electrochromatic materials, lamps, light-emitting diodes (LEDs), liquid crystal displays, LED displays, photodiodes (or functionally equivalent devices including photoresistors), sound-active materials (including electrostatic microphones, magnetic speakers and electrostatic speakers), conductors for use as wireless antennae, and conductors for use in sensing moisture.

Preferably the conductors, the electrodes and the at least one connection means are applied to the poster itself, so that the poster also serves as the CSBS.

Preferably the specified area containing the electrodes includes pairs of conductors; each of the or each pair having a shape of two-part interleaved electrodes capable of serving as transverse capacitor plates, which, when in use, are surrounded by an electric field that propagates through the poster and adjacent dielectric materials including air.

Alternatively at least one specified area is placed in relation to a proximity sensor comprised of a single electrode, which when in use, is surrounded by an electric field that propagates through the poster and adjacent dielectric materials including air.

Optionally one part of the two-part electrode is printed on one side of a substrate and the other part is printed on the other side.

Preferably the electrodes, the conductors and the connector pads are composed of one or more electrically conductive materials fixed in place upon the CSBS.

Preferably the suitable electrically conductive material is selected from a range including (without limitation): conductive inks, conductive pastes, conductive powders, conductive fibres, conductive films, conductive foils, conductive wires, base metals, alloys, conductive polymers or combinations thereof, and includes substantially transparent conductive materials.

Preferably the electrically conductive materials are deposited onto the CSBS by use of a method selected from a range including: printing, screen printing, ink jet printing, laser printing, offset printing, lithographic printing, gravure printing, flexographic printing, painting, laminating, bonding, electrostatic transfer, powder sintering, or vapour deposition.

Optionally the electrically conductive materials are selectively removed from a substantially conductive substrate using a method selected from a range including: etching, machining, stamping, cutting, or chemical deactivation.

Optionally the CSBS is made by passing a substrate through a computer-controlled device; such as an ink-jet or laser printer delivering a conductive ink on to the substrate under control by a graphic printing program.

Preferably the customised layout of sensing areas is applied to the substrate in accordance with the particular layout of indicia on the poster by means of a computer-driven application means.

Optionally more than one type of conductor application process is applied to the CSBS; where the more than one process includes more than one of the methods previously described in addition to hand or robotic addition and/or removal of conductive wires, tapes, or sheets and/or other electronic devices as previously described in this section.

Preferably the CSBS is selected from a range including: paper, paper impregnated or coated with a material including a wax, celluloid, or a plastics resin, cardboard, a single plastics material, a blend of more than one plastics material, polymer films, thermosetting polymer films and thermoplastic polymer films; including without limitation sheets made of polyester, vinyl, polyamide, polyimide, acrylic, acetate, acetal, celluloid, polycarbonate, styrene, silicon, PVC, ABS, PET, PEN, or a blend of more of plastics materials.

Preferably the dielectric sheet material is flexible and can be applied to two- or three-dimensional surfaces.

Preferably the poster can be easily replaced with another to update the printed indicia or graphic content of the display.

Preferably the CSBS can be easily replaced with another to update the design or layout of the proximity sensitive areas.

Preferably the viewer-responsive information display of the poster is capable of being viewed in reflected light.

Alternatively the poster and the CSBS and electrodes are at least partially translucent so that the viewer-responsive information display poster is capable of being viewed in transmitted light without adverse visual disturbance caused by visible patterns of electrodes.

Preferably the poster and the CSBS are mounted behind or sandwiched between a transparent dielectric material of up to about 10 cm in thickness so that the poster and CSBS are protected, contained, and supported, without affecting the proximity sensitive nature of the interactive information display.

Optionally the mounted-together poster and CSBS include at least one cut-out so that the proximate viewer may view or access one or more input or output devices through the interactive display.

Optionally the configuration of the poster (size or shape) is substantially unlike the configuration of the CSBS and for example is comprised of more than one independent piece that is separately mounted over the CSBS.

In yet another aspect, a conductive sheet connected to earth (ground plane) is placed behind or around the CSBS in order to shield the electrodes thereupon from being inadvertently triggered by proximity-related events originating in relation to another poster display installed on the back surface.

In a second broad aspect the output device comprises digital computing means capable of receiving a poster-specific overlay of instructions and data into a storage means and then capable of immediately responding in accordance with a predetermined set of instructions in combination with the poster-specific overlay of instructions to the proximity of the viewer to a localised and identified part of the poster by carrying out at least one action selected from a range including: activation of one or more lights; activation of replay means including replay of stored speech, replay of stored music, replay of stored fixed or moving images from a stored library, or dispensing of printed material, so that the viewer can interact with the poster and gain more information from the poster than is available from an un-activated poster.

Alternatively this broad aspect of the invention may be thought of as comprising apparatus capable of detecting a valid selecting action in relation to a selected part of the sensitised poster and of generating and providing information relative to each selected part if selected is provided.

Optionally additional inputs or sensing means including optical proximity sensing, thermal proximity sensing, sensing of sound, sensing of a payment (including card payment readable/writable smart cards) and use by the viewer of a simulated or actual keyboard may be used.

Preferably the output device is also capable, when responding, of supplying data to be downloaded by wireless means including use of light beams and radio signals for reception into a personal portable electronic data device (including without limitation a mobile telephone), in response to interaction by the person with the display.

Optionally a pattern of usage by viewers over time is recorded by the digital computing means and may be obtained for review by a person responsible for ascertaining the amount and type of interaction with the poster that has occurred.

In a third broad aspect the invention provides a method of implementing an interactive poster display wherein the method comprises the steps of:

selecting a graphic image for a predefined purpose, to become the poster, locating one or more areas on the poster suitable as starting points for interactive activity by a person viewing the poster in close proximity; the interactive activity generating an output to the viewer apparently arising from the poster.

designing a layout of electrodes upon a CSBS such that the or each starting point on the poster is related to a corresponding densely packed array of electrodes, each array being separately or in combination joined to a connector connectable to a site-specific proximity sensing means, transferring the layout on to the CSBS using a conductive material, mounting the poster in front of the CSBS and inside a protective case at a viewing site, creating at least one output to the viewer in the form of a selected sequence of appropriate, digitally stored data, and storing the at least one sequence together with a link to at least one site capable of being separately recognised by the proximity sensing means within a storage medium, so that, when in use, a selected sequence is reproduced through an appropriate interface, in response to the proximity of a viewing person.

In a related aspect a first modified method comprises the extra step of monitoring usage and updating the digitally stored data with a more appropriate selected set of interactive responses.

In another related aspect a second modified method comprises the step of monitoring usage and if necessary, improving and updating the CSBS as well as the digitally stored data.

In a further related aspect a third modified method comprises the step of monitoring usage and if necessary, then replacing the poster only with a replacement poster having a different appearance although having points of interest at the same places as did the original poster.

PREFERRED EMBODIMENT

The description of the invention to be provided herein is given purely by way of example and is not to be taken in any way as limiting the scope or extent of the invention.

Throughout this specification, unless the text requires otherwise, the word "comprise" and variations such as "comprising" or "comprises" will be understood to imply the inclusion of a stated integer or step or group of integers or steps but not the exclusion of any other integer or step or group of integers or steps.

DRAWINGS

FIG. 6 as 6A: (face view) and 6B: (section across A-A from 6A): includes the connector used to join the electrodes on the CSBS to the charge transfer controller and to printed-circuit board (PCB) pads associated with electronics housed in the enclosure.

FIG. 7: shows the conductive pads on the PCB that mate with the pads on the CSBS along with the rubber cones (shown in an open position) that press corresponding pads together.

DETAILED DESCRIPTION

This invention is based on broadening the applications of existing proximity sensing electronic devices. It provides interactive advertising, information displays, ticket selling and the like; for each instance of which a custom-designed yet cheap and disposable electrode array is applied to a sheet of commonplace non-conductive material (a CSBS as in FIG. 2). The electrode array is compatible with use by a capacitive proximity sensor device and has been laid out to suit a specific graphics display or other information printed on a sheet herein called "a poster" (as in "a large printed picture"—see Definitions) for simplicity. The layout places each electrode array below a part of the poster expected to raise interest by a person viewing the poster, and hence initiates an interaction by detecting proximity between the person's hand and an identified electrode. One example poster—though lacking any promotional text—is shown in FIG. 1. By rendering the display capable of interaction based on or more modalities with a nearby person, the invention aids the person seeking relevant information, and indirectly aids the person providing the information. The invention also provides single or multi-media outputs to the public, responsive to one or more outputs of proximity sensing electronic devices. The single or multi-media outputs may be managed by a stand-alone digital media player, or alternatively by a digital computer which has a richer set of capabilities, such as data logging, analysis of usage data, Internet communications, printing and the like.

A broad description is provided in the following numbered paragraphs.

Planning of Electrode Layouts.

1. Each specific proximity-sensitive area is in effect a two-dimensional capacitor with capacitor electrodes laid out close to each other. Interdigitation of the electrodes increases the electric field nearby and is used to "focus" the sensitive area in relation to a specific part of the associated poster. For details see FIGS. 1 and 2, and associated text.

2. Any part of a surface bearing indicia (whether opaque, translucent or transparent) may be made proximity sensitive by means of charge transfer from electric fields emanating from electrodes laid out behind upon or within the sheet, and it is quite feasible with current supporting electronic products to have up to 48 or more discrete (non-overlapping) and distinguishable areas in use.

3. Noting that the purpose of the invention is to help a user to acquire some specific information, there is a preparatory process wherein a designer evaluates the available indicia with respect to digitally stored or generated information, and constructs a matching table, in concept, that links the proximity sensitive sites to the information.

Figure 3:
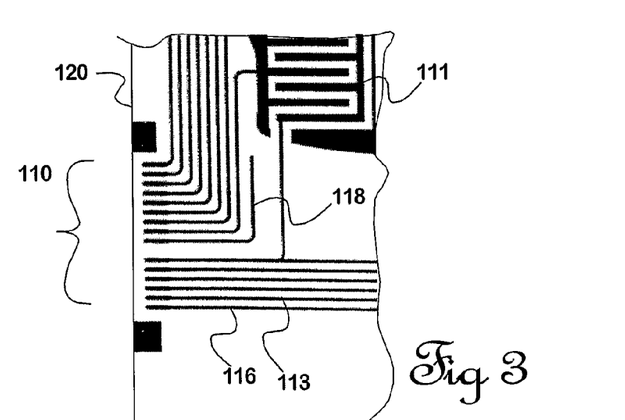
FIG. 3: shows details of the connector pads on the backing sheet customised sensor-bearing substrate which will be connected to a printed circuit board containing the charge transfer controller and associated electronics.

4. The proximity sensitive sites are a number of transverse electrodes having the appearance of paired-sets of inter-digitating traces; each pair being alternately routed to one input and one output at the connection point on the substrate (FIG. 3), with no conductive connection between paired sets. The electrodes may be multiplexed wherein two or more electrodes are branched off a common input or output trace. For details see FIG. 2.

5. According to the invention, the electrically conductive electrodes are created on a backing sheet (herein referred to as a CSBS) with reference to selected parts of the accompanying poster and are laid out together with connecting traces leading to connector. Specific patterns of paired conductors can vary significantly in shape, size and may have straight or curved boundaries.

6. Specific layouts may be computer-generated using software intended for printed-circuit board layouts such as "PROTEL" (Altium Inc), or software capable of 2-D drafting such as "AUTOCAD" or "AUTOSKETCH" (both Autodesk products) or similar. That would be in accordance with the intention to provide cheap, replaceable conductive electrode layouts on paper so that advertisements and their proximity-sensing layers can be changed or updated easily.
7. At the technology level, a paired-electrode proximity sensor is usually preferred. This mode of operation is more stable than a single-ended sensor using just a flat area of conductor with electrical reference to ground, but which is more liable to interference from stray electric signals including mains frequency and radio waves. The currently preferred Quantum QMatrix controllers have internally generated signal patterns that are resistant to interference.
8. A ground plane behind the display is often advisable, in order to screen the rear of the display from unintentional proximity contacts, or in order to render the active areas more specific. This might comprise a flat continuous or interrupted rear conductive sheet or a trace that wanders between the active areas, or a metal-backed box containing the display.
9. If the customised layout of sensing areas is provided within a laminate bearing the poster on both sides it may be preferable to have a mirror image layout of the poster on one side and aligned so that the same electrode serves the same selected area on both sides. Even that could cause confusion if two persons were interacting with the poster at the same time but on opposite sides, unless each side of the poster had separate electronics. Alternatively a ground plane can be laminated in between the posters for isolation, and the poster on each side has its own electrode layer so that one side operates independently of the other side.
10. Layouts could have cut-out or inset regions to accommodate a monitor, speakers, numeric keypad or keyboard, LCD displays, or other multi-media devices. Means to receive coins, or a slot to emit printouts, apertures to emit scents, or sounds may also be provided.

Paper or Other Substrate for Electrode Arrays
1. The technology needs substantially non-conductive surfaces for the electrode mount, the adjacent indicia, and any protective or other nearby surface such as glass or plastic since these, assuming the preferred capacitive proximity sensor, should behave as dielectrics.
2. The CSBS is usually made of a flexible dielectric material such as paper, wax or plastics-impregnated paper, cardboard, or a plastics material including (without limitation) acetate, polyester, polyvinyl chloride (PVC), polycarbonate, polyethylene, polyamide, and polyethylene terephthalate (PET), or alloys of various plastics. Non-flexible dielectric materials including glass, fibreglass, plaster and wood and the like are also suitable materials for the custom sensor-bearing substrate and may be used for more durable displays.
3. The CSBS surface must be compatible with selected printable conductive inks so that traces are printed without breaks and this property may be improved if necessary by surface treatment. The designer may choose between a front-illuminated poster for which the sensor bearing substrate and its conductors may be opaque, and a back-illuminated (translucent) poster in which the sensor bearing substrate and its conductors are also reasonably translucent or transparent.
4. The custom sensor-bearing substrate is a flexible and potentially stretchy material that can be applied to three-dimensional shapes such as moulded plastics or fibreglass, for use in curved, folded, or faceted display stands (for example).

Conductive Ink or Other Conductive Layer
1. Materials tested so far include conductive inks, conductive paints, metal foils and wires. Most tend to be opaque. Conductive inks are preferred because they can be printed or disposed on substrates quickly and create fine details like conductive tracks to high degree of accuracy. Current examples include inks loaded with particles or flakes of silver, copper, aluminium, nickel, graphite, and carbon. Low-cost conductive inks are preferred according to the "disposable" concept of the poster and CSBS.
2. Translucent conductive inks are available, the preferred type being an conductive polymer such as Orgacon by Agfa-Gevaert (Belgium) which comes in both solvent and waterborne inks, pastes and in solid form as pre-coated sheets. Orgacon is flexible and can even be stretched upon a substrate while maintaining conductivity. Transparent indium-tin oxide (ITO) compositions (as used in LCD displays) are more brittle and expensive to apply but may be applicable to some applications.
3. Organic conductors applied by charge-transfer or other means are another alternative to metal particle inks and can be transparent and flexible.
4. Further materials include: conductive surfaces (such as aluminised PET sheets), metal foils compatible with computer-driven cutters, flexible printed circuits, fine wires such that their obstruction of light is hardly noticeable, and conductive fibres such as metallised textiles.
5. Additional printed electronic devices (optionally installed with robotic or manual forms of assembly) include electroluminescent panels, light-emitting diodes (optionally organic), incandescent lamps, electrochromatic devices, electrostatic or piezoelectric speaker and microphone devices, and liquid-crystal displays (LCDs).

Printing or Other Layout Process
1. Since the invention aims to produce cheap, disposable, free-form layouts, a technology such as ink-jet printing of conductive inks onto formats up to size A0 or larger is appropriate. This can be a simple, easy-to-use process for a business that prepares and prints advertisements. Other printing methods such as screen printing and offset printing offer faster application of conductive inks and are likely to be more cost-effective for volume production of the CSBS.
2. Painting or robotic spraying may be the best option for three-dimensional objects although ink-jet printing can be applied to regular shapes without difficulty.
3. Photolithographic etching may be suitable for complex shapes, as long as there is suitable chemistry available at a reasonable price—a photosensitive material and a compatible chemical etchant available (with an activity such as caustic soda for aluminium, ferric chloride for copper, or appropriate etchants for transparent inks).
4. A programmed cutter as is used widely in cut vinyl signs can be used to cut electrode arrays from metal films or metallised plastic sheets by computer control.
5. Other techniques to lay-out customised conductive patterns by combining component parts are applicable, including wires or patches containing pre-printed electrodes which are attached to the substrate with adhesives, tapes or laminates.

Connectors
1. A re-usable connector forms a part of the invention, to connect the charge transfer controller and associated electronics to the customised sensor-bearing substrate (CSBS) bearing the electrodes. The electronics may be alongside the display, as is preferred, or at the end of a connecting cable. The connector should be polarised and indexed because a number of separate connections are likely to be involved and error-free field replacement will be required. The preferred requirement is for a zero insertion force, polarised, latching connector capable of reliably making contact with a row of conductive ink pads (110 in FIG. 2) on the CSBS which may vary in thickness depending on materials used, typically from 0.2 to 0.8 mm. The number of pads used may vary depending on the ability of the proximity sensor chip to handle fewer or more active volumes.

Figures 6A, 6B, 7:
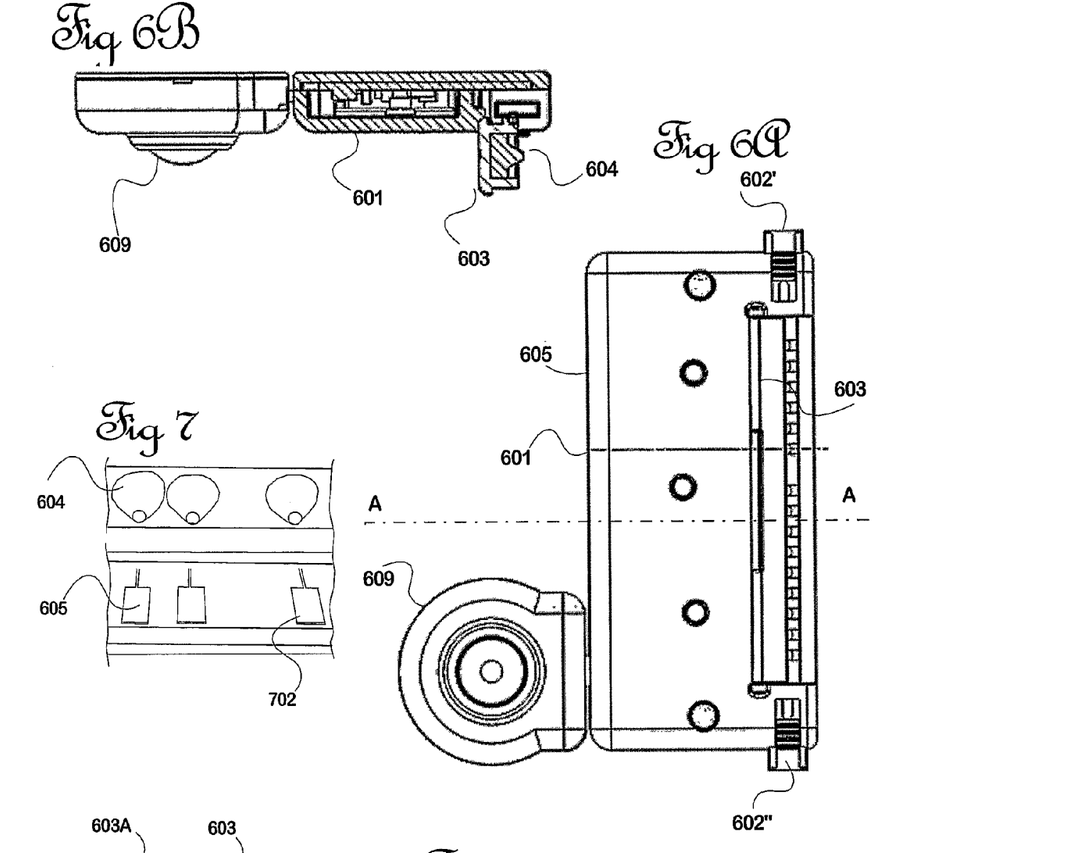
Figure 8:
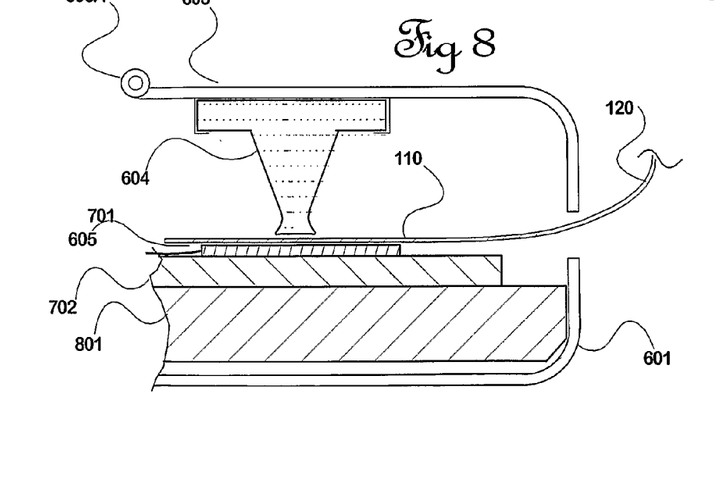
FIG. 8: is a schematic cross-section through the PCB enclosure showing a single rubber cone bearing down on the CSBS to create an electrical connection to the PCB.

2. As shown in FIGS. 6, 7, and 8, a suitable connector 603 has been designed for the purpose. (FIG. 8 is shown in a slightly exploded view). The connector includes part of the casing of the re-usable electronics module 601 and connects directly onto the CSBS (see FIG. 3), thereby shortening cable runs as far as possible. When open, the connector 603 has a gape like that of a hippopotamus. The "teeth" comprise a row of resilient cones 604 made of a cast silicone rubber located along one side of the connector. Each tooth faces a printed circuit board pad connected internally to the remainder of the circuit of FIG. 6 and is laid out in a row at the same spacing as is used for the connector on the CSBS. When the connector lid is closed, each cone presses the underlying printed conductor pad against a corresponding circuit board pad thereby applying steady contact pressure between the two pads. The connector is latched closed by means of a slidable catch (602', 602") at each side. If the catches are undone the connector will spring open again for release and re-use. The (optional) asymmetry provided by a missing conductor may be used in conjunction with a punched out part of the CSBS and a key within the connector to polarise the connector so that it can be inserted in only one way, and to help locate (in a sideways sliding sense) the corresponding pairs of pads. Placing the proximity sensing integrated circuit close to or within the connector minimises stray signal pickup that would be caused by longer sensitive leads, and minimises inductance, capacitance variations and total capacitance of longer leads that reduce sensitivity.

3. In an alternative configuration, a zero insertion force (ZIP) connector is attached to the poster and connected via a flat flexible circuit (FFC) cable or ribbon cable to a remote circuit bearing the charge transfer controller and associated electronics. Standard electronic connectors may be used on both ends of the FFC. This alternative is useful when installing posters in display cases where space restrictions make it impractical to attach any of the associated electronics directly to the CSBS.

Associated Electronics

Figure 4:
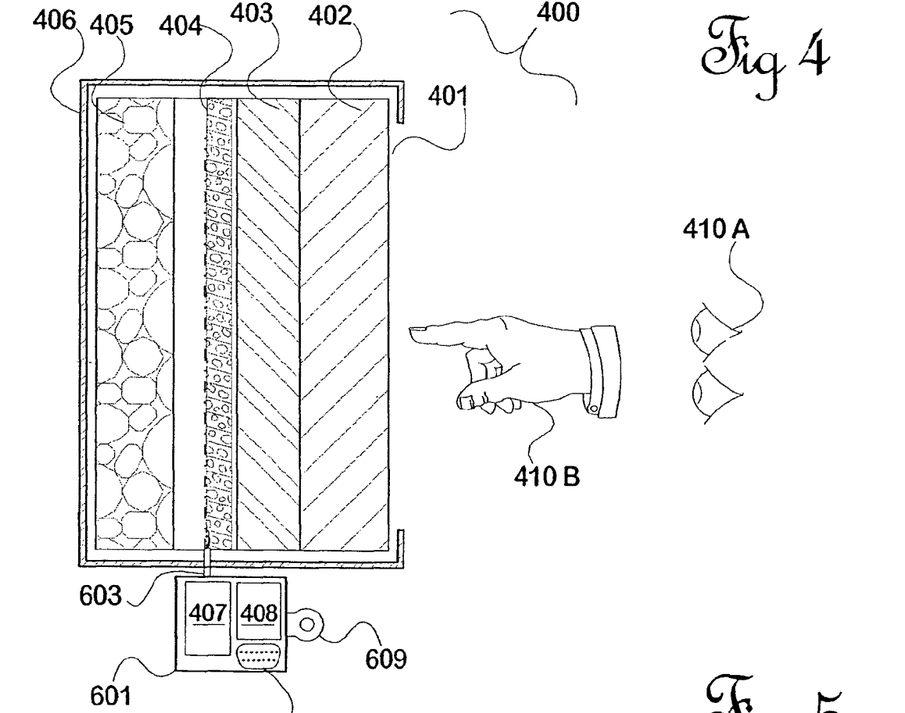
FIG. 4: shows the layers included within a typical display, greatly exaggerated in cross-section.

1. The electronics module (see FIGS. 5, 6A and 6B) is connected to the customised sensor-bearing substrate (CSBS) at a designated connector site (see 110 in FIG. 3) so that different CSBS sheets and different posters may be used with the same electronics module. Both electronics modules are re-usable although included software will be updated from time to time, since much of it is poster-specific. In FIG. 4, a configuration is shown in which the proximity sensor or charge transfer controller 407 within a first electronics unit 601 is directly connected to the multi-polar connector on the CSBS. This embodiment of a first unit uses a serial interface device 408 (which may comprise a microprocessor) wired to a serial digital data connector 506' which leads to a similar connector 506 on the second or main electronics board 500 shown diagrammatically in FIG. 5. The second or main electronics board includes a data bus 511, connecting 501: a power supply (supplied by connectors 507), 502: a central processor chip (together with supporting devices such as read-only (program) memory, clock, etc), 503: a flash memory or similar repository for holding graphics-specific instructions (what to show when) and sound and pictures (including video) to be reproduced as determined: 504 a sound output device ("sound card") coupled to speaker terminals 508, 509: and 505 a video output device ("video card") which supplies picture signals probably in the well-known VGA format through connector 510 to a display device. 512 represents a maintenance port used for downloading new graphics-specific instructions and data into the flash memory, and for uploading usage information if required. This set of parts may be replaced by a scaled-down "PC motherboard" or the like as supplied for embedded use.

2. Placement of the box may be other than within the panel, such as to minimise vandalism or theft, for larger size, and for service accessibility.

3. An important part of the re-usable electronics is proximity sensing means: here, the charge transfer controller chip (407) for capacitative proximity sensing. The current preference is for a QT60486 from Quantum Research Group which provides a digital output indicating the reasonably certain detection of an object at one of many identifiable sensing areas or volumes. That output is used in order to select a specified set of information to be reproduced.

4. Optional variations include not using a digital computer device within the unit shown in FIG. 5. These may use a variety of digital media players are presently available for purchase: one example described as "Programmable MP3 Audio Players for Kiosk Applications". (ITB Compuphase and other suppliers).

5. The electronics module may accept sensors with a greater activation range than offered by capacitative proximity sensors. For example, the reflective optical sensor (609) shown in FIGS. 4, 6A and 6B is a plug-in module that has an activation range of up to 10 meters and can activate multi-media outputs so as to initially attract viewers to use the interactive information display.

6. The electronics module initiates commands to activate output means to a viewer which are likely to include (without limitation) a speaker, a monitor or display, a printer, controllable lights, a printer, or less usual devices such as a perfume vaporiser.

7. The electronics modules may include status lights for use during servicing.

8. The electronics module may optionally send information, via wired or wireless communications devices, to remote devices or places.

9. Power for the electronics may be one or more of: a simple battery, a rechargeable battery, a mains—driven power supply, solar panels and management for them, or a dynamo.

Poster Mounting

1. A poster and CSBS may be mounted (for example) on a wall, behind a glass- or plastic-fronted frame, behind a glass or plastic sheet also forming a display cabinet, inside a shop window, or within a free-standing display such as an acrylic menu holder. For details see FIG. 4 and associated text.

2. The invention allows 3-dimensional "posters". The flexible substrates used for both poster and CSBS may be installed in curved display frames, folded or faceted display frames, arbitrarily curved surfaces when the conductors are applied directly onto the surface, or arbitrarily curved surfaces if the flexible substrates and conductors are capable of being stretched or moulded around the surface.

3. Protective, transparent sheets of up to approximately 10 cm thickness can be placed between the poster with the CSBS yet the dielectric nature of the transparent material maintains or may enhance the effect of a nearby viewer on the capacity of an electrode beneath. Suitable materials include glass and polycarbonate resin.

Example 1

Advertising Display

FIG. 1 shows a poster of a sports car advertisement 100 and a corresponding layout on a flexible sheet of paired capacitive-sensitive electrode sets is shown as 120 in FIG. 2. The flexible sheet 120 is intended to be placed close behind the poster 100 when in use and is connected at connector 110 to a first electronics block 601. This example of a sports car and a corresponding sheet bearing a specific layout of electrodes do not, of course, limit the scope of the invention which may be used with many other images, or with other applications as described later. Areas made sensitive to proximity of a finger for example are provided with closely spaced sets of inter-digitating electrodes, each energised alternately so that the proximity of a conductive object (such as a hand or finger) changes the inter-electrode charge.

The design process begins by considering what might attract the attention of a passer-by within the picture of the sports car. One or more areas about which a person may require more information are selected. In this instance head-lights 101, engine 107, wheels/steering 104, boot 103, windscreen 102 and exhaust 105 have been identified as likely to provoke enquiry and are provided with sensitive areas (head-lights 111, engine 117, windscreen 112, wheels/steering 114, boot 113, and exhaust 115) by means of the underlying electrode array. Each electrode pair is connected to a connector array 110 by a line of conductive material and for example the electrode 115 is served by trace 116 and by trace 113. During use, if a person brings his or her hand close to an activated part of the poster; the headlights at 101 for example, the underlying electrode assembly 111 will exhibit a small but measurable capacity change that will be sensed by the charge transfer controller attached to connectors 110. As a result of the detected proximity there would be some intended delivery of information from the linked electronics (see FIG. 5) such as some audio sequence, or a video sequence describing the attributes of the headlights.

FIG. 4 shows an example poster mounting in cross section; this example is lit by incident light, and is not back-lit. 400 generally indicates a section in a horizontal plane through a display board, with the thicknesses of parts greatly exaggerated. 401 is a viewing aperture letting a person (eyes: 410 A) see a poster inside a mount, frame or protective case 406, through an optional window 402 comprising for example a sheet of clear glass—preferably a toughened glass, or a plastic material. Its physical purpose is protection. The glass 402 also has a useful property as a dielectric that tends to enhance the capacitive effect of a person's hand (410 B) on the nearest electrode array in particular. 403 is a non-conductive poster or other sheet material bearing indicia—see for example the sports-car example of FIG. 1. The poster is preferably also a dielectric material (assuming use of a capacity-based proximity sensor) and is compatible with a printing process. 404 is a replaceable non-conductive sheet bearing conductive patterns as shown in face view in FIG. 2, laid out in a manner spatially related to points expected to be of particular interest in FIG. 1. 405 is an optional resilient backing sheet used to press the entire laminate together within the frame 406, although the degree of physical and electrical stability required may not require that degree of closeness. Glue or other materials, electrostatic attraction, even a tight fit, may be used.

There is preferably a water-resistant seal around the edge of the frame made by aperture 401 over window 402, particularly if the display board is to be used outdoors.

For a transparent, back-lit display, layer 405 may be replaced by a light source such as one using an array of white light-emitting diodes behind a diffuser with heat radiated towards the rear surface of the case, and the electrodes of layer 404 may be comprised of effectively transparent conductors or a translucent conductive ink. Poster 403 may be a transparency such as ink on PET (Mylar™) sheet or photographic film, and a glass pane (or clear plastics sheet) 402 would be retained to serve as a protective cover.

The entire display may face both ways. Use of a conductive ground plane beneath the electrode-bearing layer isolates the electrodes on one side from events on the other side, behind the ground plane, hence a bidirectional display would have a core of a conductive ground plane and a cross section through one has the sequence 401-402-403-404 (ground plane) 404-403-402-401. The poster could be deliberately printed with the electrode pattern visible, which would overcome the transparency problem and allow a single sheet to carry out the functions of 403 and 404 in FIG. 2; saving on costs and any replacement problems.

Maximising the Replaceability Aspect

1. If the basic image 403 (or FIG. 1a) is changed for a new poster, the underlying electrode array 404 on a sheet of commonplace material and the corresponding information in memory storage module 503 would also be changed for a new layout and a new set of information.
2. The electrode array 404 on its sheet (the CSBS) could be replaced at any other time if it is believed to be defective.
3. If usage reports (see below) indicate that certain parts of the poster 403 are receiving unexpectedly high levels of attention, then the electrode array 404 could be modified and replaced under the same poster in order to resolve attention to those parts more closely. This would give better customer feedback as well as more information about just what is of interest. Also the corresponding information in memory storage module 503 would be enhanced at the same time and reloaded in order to reflect the increased detail.

The case 406 is openable to allow replacement of electrode layer 404 and poster layer 403 as and when required. Item 110 on the electrode array (see FIG. 3 and description) is a field-pluggable connector, used for joining a non-replaceable electronics unit 601 (see FIGS. 4 and 6) to the replaceable electrode array on the CSBS. That unit is an electronic information selector serving as a response delivery unit. The unit may also include a pluggable infra-red sensor 609 which is used to sense a person near the poster but out of range of the proximity sensors. Information may for example be stored in device 503 as identified text files, sound files (type .WAV is a current example), image files, (type .JPG for example), and video files (type MPG for example). In other applications the information may be stored as spreadsheets, runnable code, or links to web pages as appropriate. Alternatively the unit may comprise a personal computer motherboard, available commercially in a scaled-down form for use in embedded electronics.

Placement of the box may be other than within the panel, such as to minimise vandalism or theft, for larger size, and for service accessibility. Memory module 503 holds information related to a specific poster 100 along with specific electrode array 110, and would be changed or the content would be upgraded at the same time as the poster is replaced, using a serial (RS-232 or USB or similar) connection to a flash ROM ("thumb drive") or the like, a small hard disk drive, or a functional equivalent thereof. It may be cost-effective and more manageable to get the information from a server across a wired or wireless network each time an update is required.

Optional versions of the electronics box also include means to log the number of genuine interactions (and corresponding data such as time-of-day) with each of the available sensors, and to allow that information to be accessed remotely from time to time. Another option will include a communications interface such as a mobile phone, wired telephone line, or wireless network node connected to the electronics module, so that status and usage data may be read remotely, and so that revised information may be sent to the memory module 503 inside any one or to all the poster display devices distributed throughout a region.

Figure 9:
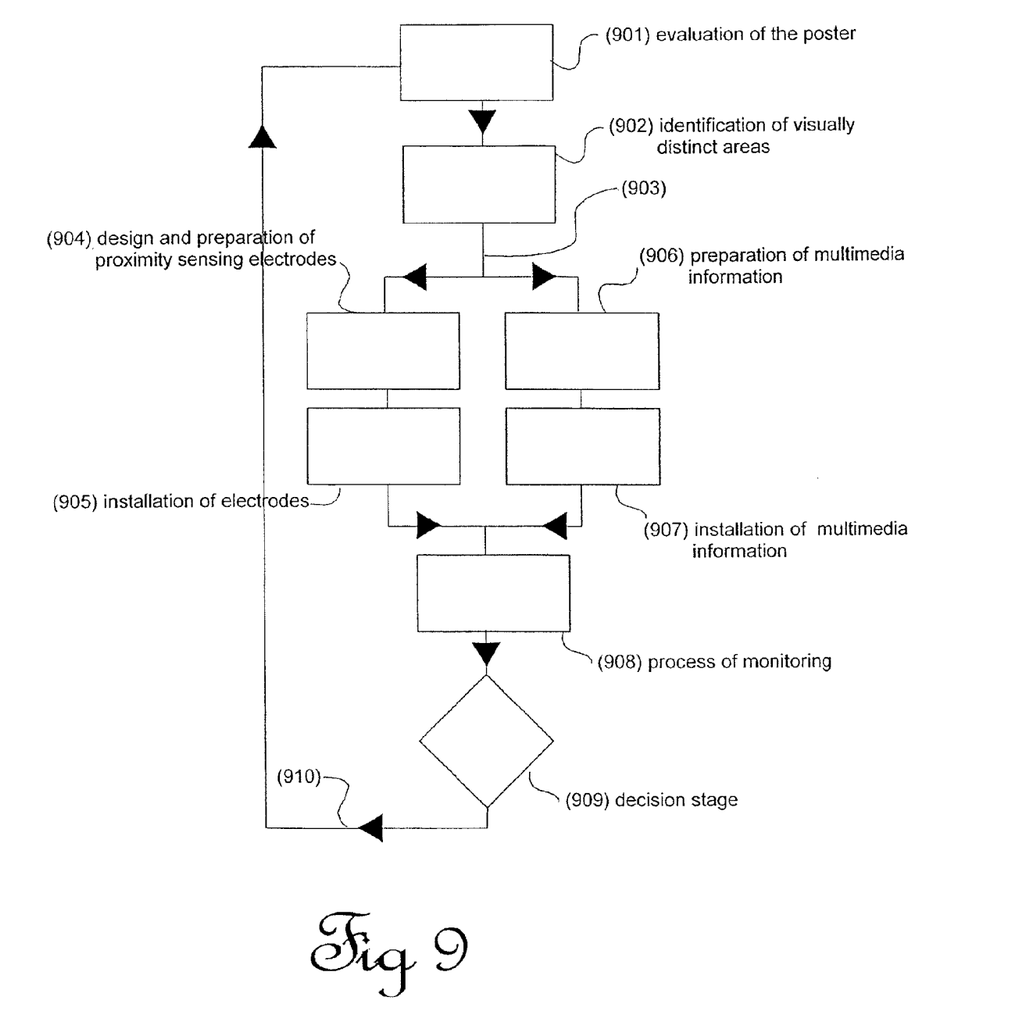
FIG. 9: shows a flow chart showing how a given display may be subjected to improvement.

The flow chart of FIG. 9 illustrates development and maintenance of a display. Box 901 represents evaluation of the poster by a specialist. Box 902 represents identification of the visually distinct areas of the poster to be made proximity sensitive. Path 903 branches to show two parallel activities. Box 904 represents design and preparation of the replaceable array of proximity-sensing electrodes on a substrate. Box 905 represents installation of the matrix beneath the poster. Box 906 represents preparation of multi-media information that corresponds to each separately selectable area of the poster. Box 907 represents installation of that information and means to deliver it alongside the poster. Box 908 represents a process of monitoring and evaluating actual public usage of each portion of the poster. Box 909 represents a decision stage—asking should the development process outlined from box 901 onwards be repeated, and improved? If so, line 910 takes control back to box 901.

This type of electronically aided monitoring of public interaction is likely to be useful when preparing further advertising campaigns, especially if joined to a device to count the number of people who pass by.

Example 2

Version Including a Digital Computer

Figure 5:
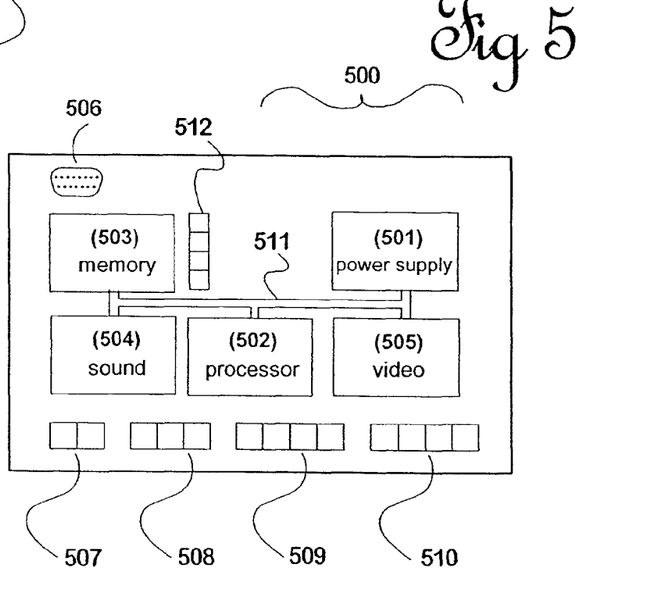
FIG. 5: is a block diagram of one embodiment of a microprocessor unit to be attached to the connector on the replaceable paper-like customised sensor-bearing substrate (CSBS) and linked to a computer unit equipped to produce interactive responses.

The invention may be integrated for use with a laptop or other generic personal computer capable of running preferably a Windows, Linux or Mac operating system or a variant thereof as follows:

1. The previously described concept of disposable electrode arrays printed on a sheet to suit a particular poster is retained, along with reconnectable connection to (2) below.
2. A proximity sensor integrated circuit is built into or beside the connector close to the actual electrode arrays, as represented by box 601 in FIG. 4.
3. FIG. 5 now comprises the laptop or other generic personal computer. A data link to the PC preferably comprises a USB format link since RS-232 facilities are now substantially obsolete in generic personal computers. A conversion module to convert RS-232 into USB data, or options such as an infra-red link or a wireless network, such as the 802.11g format, may be needed if the proximity sensor integrated circuit does not itself offer that mode.
4. Functions previously handled in the electronics module are now handled by the PC under software control. The software may perform the following functions:
   a) providing audio (speech, music, or sounds) as appropriate to the particular activated proximity sensor—from either a stored file or synthesised speech appropriate to the occasion,
   b) providing graphics and/or video images either from a stored file or by generating graphics according to a combination of incoming data (such as time of day) and stored data,
   c) providing hard-copy output in the form of printouts, tickets, leaflets and the like,
   d) creating and maintaining statistics of use; also monitoring for defective performance,
   e) and communicating information such as status, statistics, downloaded files and the like to and from remote servers over a communications link.
1. Optionally, one computer may control and monitor several posters together over a network and may return sound or graphics or other media outputs to each display board. This option would lower costs in situations where multiple posters are displayed.

Example 3

Applications in Education

In this application the direct relationship between finger position and information is exploited. Consider teaching art history. A replica of a painting could comprise the poster. Each portion of the painting having meaning or significance can be equipped with a proximity electrode set, and an information delivery device (such as a speech unit) can be provided with a short relevant note about the corresponding portion. Then when a person points at (for example) the forearm of the ermine held by the Duke of Milan's concubine as painted by Leonardo da Vinci in "Lady with an ermine", the person will be told that the symbolism of that muscular forearm is an allusion to the Duke's power. If the person moves a little and points generally at the ermine, the speech unit will describe an ermine and refer to the pun used by da Vinci relating the word "ermine" in Italian and the name of the Duke. It would be easy to select up to 20, 32, or 48 specific areas of such a painting and prepare notes for each. The poster, the electrode array, and the information-loaded electronics can be distributed to schools as a teaching aid. This is an effective teaching method because of the close relationship between the act of pointing to an interesting part of the picture and the response (hearing about it).

Another application, likely to use hidden or transparent electrodes, relates to a backlit X-ray (radiograph) to be used for teaching doctors or radiologists. Some features of an X-ray used in diagnosis are inherently quite subtle and a skilled radiologist has gained an enhanced ability to examine a radiograph. The directness of selected information returned by means of this invention enhances the process of teaching X-ray interpretation.

The same idea can be applied to any teaching material represented as a picture, chart or table, such as the Periodic Table of chemistry, or multiplication tables.

Example 4

Patients with Disabilities

Some persons, such as those with neurological disorders such as strokes are not able to speak. Some can communicate only by pointing at or touching a card with "YES" and "NO"—and perhaps "HELP" or alternatively large coloured or patterned areas on it. The present invention allows custom design of cards suited to an individual's level of capability that the person can use to communicate with nursing staff. The interactive cards can be interchanged for more complex ones as the patient recovers and their abilities increase. The disposable and cheap nature of the invention provides for (a) low-cost replacement in case of breach of sterility, (b) use of large surfaces if required, and (c) ease of redesign for testing what layout suits a particular patient.

Example 5

Trade Show Unit with Data Collection

For a trade show booth (such as a car show, home accessories show, boat show or the like) the invention provides a unit according to previous descriptions in this section that may be hired by a stall-holder, including support for a reusable poster linked to a user-loaded information dispenser of an appropriate type (such as one that prints out in real-time a brochure supporting with details the particular part of a poster that was selected). The physical appearance of a poster equipped with the technology would be a flat, thin sheet with optional glass or plastic front surface, conveniently held in a frame that may be free-standing or put up on a wall of the booth at eye height. A monitor or speaker set may be placed behind, beside, or within the border of the frame.

For this subject area, the automatic collection of trade-show booth interest statistics is of particular interest. At arrival to the show, visitors are often given a name tag to wear which contains an RFID (radio-frequency identification device) transponder. This carries or is linked to visitor name and address information that permits an interrogation device to communicate the transponder. When the visitor interacts with the proximity sensitive display (400 in FIG. 4) the RFID data can be read in combination with the proximity event. The stall holder may follow up the expression of interest, knowing exactly which aspects of the poster the visitor was interested in or queried. If national privacy laws require it, a person can press a suitably labelled button on the poster to suppress the saving of such data.

INDUSTRIAL APPLICABILITY AND ADVANTAGES

The invention provides a low cost technique for rendering posters, placards and flyers interactive, the better for dispensing or vending information, reproducing experiences, providing samples of products, entertainment, or for education.

The low-cost materials used for the printed poster and customised sensor bearing substrate make it feasible to replace the poster and associated sensor layouts on a periodic basis. This will appeal to advertisers and retailers whose promotional displays are short-lived and frequently updated.

Interactive posters can be created which are only a few millimeters in thickness, including the supporting frame. Attractive curved or shaped displays can be created because the substrates are thin and flexible.

Interactive posters may be hung on or mounted into a wall, placed in a shop window, put on a table or on the floor, or else a free-standing display stand. It is relevant to applications inside buildings, in shelters, on street furniture, or information kiosks.

The printed interactive display is significantly cheaper to produce than traditional touch-screen kiosks and can be placed in outdoor venues that advertisers would otherwise not normally consider for fear of damage due to vandalism or the weather.

The physical loading process of the poster and customised sensor-bearing substrate into a frame is simple and can be done in less than one minute, including replacement of the digitally stored information.

Interactive posters may be provided with interaction-logging means in software so that analysts can determine which parts catch the public's attention best for future marketing campaigns.

The technique allows creation of "alive, communicative" product advertising, promotions, educational and information-providing displays that respond to the human presence and to being pointed at. The result is an interactive type of display which lets the person choose what they want to learn about, holds the person to the display for longer and provides much more information than a conventional printed poster.

Finally, it will be understood that the scope of this invention as described and/or illustrated herein is not limited to the specified embodiments. Those of skill will appreciate that various modifications, additions, known equivalents, and substitutions are possible without departing from the scope and spirit of the invention as set forth in the following claims.

I claim:

1. An interactive information display employing capacitive proximity sensing means in order to respond in a specific manner to a viewer in proximity to the display (the "proximate viewer") wherein the display includes (a) visible indicia laid down upon a substrate (herein called "a poster"), (b) a replaceable non-conductive substrate (herein called a "customized sensor-bearing substrate") bearing a layout of at least two conductors; (c) each conductor terminating in one of at least one pair of areally enlarged, closely apposed yet separated conductors (herein called "electrodes") that serve to spatially localise a proximity-sensitive field, the at least one electrode pair being located within at least one selected area in relation to the overlaid poster when the customized sensor-bearing substrate and the poster are mounted together and providing, when in use, a localised proximity-sensitive function capable of being identified with a localised part of the poster selected by the proximate user, (d) at least one disconnectable connection means capable of connecting the customized sensor-bearing substrate to at least one non-replaceable charge transfer controller, capable of using the at least one electrode pair as a localised proximity sensing means, which controller in turn is connected to (e) at least one non-replaceable output device capable of selecting and sending a communication, based on the content of the selected area of the poster to the proximate viewer.

2. A display as claimed in claim 1, characterized in that the customized sensor-bearing substrate is comprised of a sheet material having a dielectric property.

3. A display as claimed in claim 1, characterized in that the conductors, the electrodes and the at least one connection means are applied to the poster itself, so that the poster also serves as the customized sensor-bearing substrate.

4. A display as claimed in claim 2, characterized in that the specified area containing the electrodes includes pairs of conductors; each of the or each pair having a shape of two-part interleaved electrodes capable of serving as transverse capacitor plates, which, when in use, are surrounded by an electric field that propagates through the poster and adjacent dielectric materials including air.

5. A display as claimed in claim 2, characterized in that at least one specified area is in relation to a proximity sensor comprised of a single electrode, which when in use, is surrounded by an electric field that propagates through the poster and adjacent dielectric materials including air.

6. A display as claimed in claim 4, characterized in that the electrodes, the conductors and the connector pads are composed of one or more electrically conductive materials fixed in place upon the customized sensor-bearing substrate.

7. A display as claimed in claim 6, characterized in that a suitable electrically conductive material is selected from a range including: conductive inks, conductive pastes, conductive powders, conductive fibres, conductive films, conductive foils, conductive wires, base metals, alloys, conductive polymers or combinations thereof.

8. A display as claimed in claim 7, characterized in that the electrically conductive materials are deposited onto the customized sensor-bearing substrate by use of a method selected from a range including: printing, screen printing, ink jet printing, laser printing, offset printing, lithographic printing, gravure printing, flexographic printing, painting, laminating, bonding, electrostatic transfer, powder sintering, or vapor deposition.

9. A display as claimed in claim 7, characterized in that the electrically conductive materials are selectively removed from a substantially conductive substrate using a method selected from a range including: etching, machining, stamping, cutting, or chemical deactivation.

10. A display as claimed in claim 2, characterized in that the customized sensor-bearing substrate is selected from a range including: paper, paper impregnated or coated with a material including a wax, celluloid, or a plastics resin, cardboard, a single plastics material, a blend of more than one plastics material, polymer films, thermosetting polymer films and thermoplastic polymer films; including without limitation sheets made of polyester, vinyl, polyamide, polyimide, acrylic, acetate, acetal, celluloid, polycarbonate, styrene, silicon, PVC, ABS, PET, or PEN.

11. A display as claimed in claim 2, characterized in that the customized sensor-bearing substrate is flexible and can be applied to two- or three-dimensional surfaces.

12. A display as claimed in claim 1, characterized in that the poster can be easily replaced with another to update the printed indicia or graphic content of the display.

13. A display as claimed in claim 1, characterized in that the customized sensor-bearing substrate can be easily replaced with another to update the design or layout of the proximity sensitive areas.

14. A display as claimed in claim 1, characterized in that the viewer-responsive information display of the poster is capable of being viewed in reflected light.

15. A display as claimed in claim 1, characterized in that the poster and the customized sensor-bearing substrate and electrodes are at least partially translucent so that the viewer-responsive information display poster is capable of being viewed in transmitted light without adverse visual disturbance caused by visible patterns of electrodes.

16. A display as claimed in claim 14, characterized in that the poster and the customized sensor-bearing substrate may be mounted behind or sandwiched between a transparent dielectric material of up to 10 cm in thickness so that the poster and customized sensor-bearing substrate are protected, contained, and supported, without affecting the proximity sensitive nature of the interactive information display.

17. A display as claimed in claim 1, characterized in that the mounted-together poster and customized sensor-bearing substrate include at least one cut-out so that the proximate viewer may view or access one or more input or output devices through the interactive display.

18. A display as claimed in claim 1, characterized in that the configuration of the poster (size or shape) is substantially unlike the configuration of the customized sensor-bearing substrate and is comprised of more than one independent piece that are mounted over the customized sensor-bearing substrate the customised sensor-bearing substrate and the poster are mounted together.

19. A display as claimed in claim 2, characterized in that a conductive sheet connected to earth (ground plane) is placed behind or around the customized sensor-bearing substrate in order to shield the electrodes thereupon from being inadvertently triggered by unrelated events originating behind the poster display.

20. A display as claimed in claim 2, characterized in that a conductive sheet connected to earth (ground plane) is placed behind or around the customized sensor-bearing substrate in order to shield the electrodes thereupon from being inadvertently triggered by proximity-related events originating in relation to another poster display installed on the back surface.

21. A display as claimed in claim 1, characterized in that the output device comprises digital computing means capable of receiving a poster-specific overlay of instructions and data into a storage means and then capable of immediately responding in accordance with a predetermined set of instructions in combination with the poster-specific overlay of instructions to the proximity of the viewer to a localised and identified part of the poster by carrying out at least one action selected from a range including: activation of one or more lights; activation of replay means including replay of stored speech, replay of stored music, replay of stored fixed or moving images from a stored library, or dispensing of printed material, so that the viewer can interact with the poster and gain more information from the poster than is available from an un-activated poster.

22. A display as claimed in claim 21, characterized in that additional inputs or sensing means including optical proximity sensing, thermal proximity sensing, sensing of sound, sensing of a payment (including card payment readable/writable smart cards) and use by the viewer of a simulated or actual keyboard may be used.

23. A display as claimed in claim 21, characterized in that the output device is also capable, when responding, of supplying data to be downloaded by wireless means including use of light beams and radio signals for reception into a personal portable electronic data device (including without limitation a mobile telephone), in response to interaction by the person with the display.

24. A display as claimed in claim 21, further characterized in that a pattern of usage by viewers over time is recorded by the digital computing means and may be obtained for review by a person responsible for ascertaining the amount and type of interaction with the poster that has occurred.

25. A method of implementing an interactive poster display characterized in that the method comprises the steps of:

a) selecting a graphic image for a predefined purpose, to become the poster,     b) locating one or more areas on the poster suitable as starting points for interactive activity by a person viewing the poster in close proximity; the interactive activity generating an output to the viewer apparently arising from the poster,     c) designing a layout of electrodes upon a customized sensor-bearing substrate such that the or each starting point on the poster is related to a corresponding densely packed array of electrodes, each array being separately or in combination joined to a connector connectable to a site-specific proximity sensing means, d) transferring the layout on to the customized sensor-bearing substrate using a conductive material, e) mounting the poster in front of the customized sensor-bearing substrate and inside a protective case at a viewing site, f) creating at least one output to the viewer in the form of a selected sequence of appropriate, digitally stored data, g) storing the at least one sequence together with a link to at least one site capable of being separately recognized by the proximity sensing means within a storage medium, h) so that, when in use, a selected sequence is reproduced through an appropriate interface, in response to the proximity of a viewing person.

26. A first method of maintaining an interactive poster display made according to claim 25 characterized in that the method comprises the step of monitoring usage and repeating steps f to h with a more appropriate selected set of interactive responses.

27. A second method of maintaining an interactive poster display made according to claim 25 characterized in that the method comprises the step of monitoring usage and repeating steps b to h using a more appropriate selected set of interactive responses.

28. A third method of maintaining an interactive poster display made according to claim 25 characterized in that the method comprises the step of monitoring usage and then replacing the poster only with a replacement poster having a different appearance although having points of interest at the same places as did the original poster.

* * * * *